(12) United States Patent
Hertz et al.

(10) Patent No.: US 6,412,685 B2
(45) Date of Patent: *Jul. 2, 2002

(54) METHOD AND APPARATUS FOR RELEASE AND OPTIONAL INSPECTION FOR CONDUCTIVE PREFORMS PLACEMENT APPARATUS

(75) Inventors: Eric Lee Hertz; Allen D. Hertz, both of Boca Raton, FL (US)

(73) Assignee: Galahad, Co., Boca Raton, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,697

(22) Filed: May 11, 1999

Related U.S. Application Data

(63) Continuation-in-part of application No. 08/789,883, filed on Jan. 28, 1997.

(51) Int. Cl.[7] .......................... B23K 35/12; B23K 1/08; B23K 5/00
(52) U.S. Cl. .......................... 228/246; 228/39; 228/41; 29/832
(58) Field of Search .......................... 228/246, 41, 39; 29/842

(56) References Cited

U.S. PATENT DOCUMENTS

| | | | | |
|---|---|---|---|---|
| 4,842,184 A | * | 6/1989 | Miller, Jr. ................ | 228/180.1 |
| 4,871,110 A | | 10/1989 | Fukasawa | |
| 5,108,024 A | | 4/1992 | Kazem-Goudarzi et al. | |
| 5,148,375 A | * | 9/1992 | Horikami ................... | 364/552 |
| 5,205,896 A | * | 4/1993 | Brown et al. ............... | 156/297 |
| 5,275,970 A | | 1/1994 | Itoh et al. | |
| 5,284,287 A | * | 2/1994 | Wilson et al. ............ | 228/180.2 |
| 5,356,658 A | | 10/1994 | Hertz et al. | |
| 5,431,332 A | | 7/1995 | Kirby | |
| 5,467,913 A | * | 11/1995 | Namekawa et al. ........... | 228/41 |
| 5,497,938 A | | 3/1996 | McMahon et al. | |
| 5,499,487 A | | 3/1996 | McGill | |
| 5,540,377 A | | 7/1996 | Ito | |
| 5,574,801 A | | 11/1996 | Collet-Beillon | |
| 5,601,229 A | * | 2/1997 | Nakazato et al. ........... | 288/246 |
| 5,620,927 A | * | 4/1997 | Lee ........................... | 29/841 |
| 5,626,277 A | * | 5/1997 | Kawada ...................... | 228/41 |
| 5,655,704 A | * | 8/1997 | Sakemi et al. ............. | 228/246 |
| 5,657,528 A | | 8/1997 | Sakemi et al. | |
| 5,662,262 A | | 9/1997 | McMahon et al. | |
| 5,687,901 A | * | 11/1997 | Hoshiba et al. ............ | 228/246 |
| 5,749,614 A | * | 5/1998 | Reid et al. ................. | 294/64.1 |
| 5,765,744 A | | 6/1998 | Tatumi et al. | |
| 6,170,737 B1 | * | 1/2001 | Foulke et al. ............... | 228/245 |
| 6,230,963 B1 | * | 5/2001 | Hertz ......................... | 228/246 |

FOREIGN PATENT DOCUMENTS

| | | | | |
|---|---|---|---|---|
| JP | 7-212023 | * | 8/1995 | ................ 228/246 |
| WO | WO 9834749 | | 8/1998 | |
| WO | WO-00/20154 | * | 4/2000 | ................ 228/246 |

* cited by examiner

Primary Examiner—Tom Dunn
Assistant Examiner—L. Edmondson

(57) ABSTRACT

A method and apparatus are disclosed for releasing solder spheres during the locating and/or placing of a pattern of conductive preforms 32 on a respective pattern of electronic pads 14 on a receiving substrate 12 for such uses as a Ball Grid Array component 24. The release mechanisms are of either compliant mechanical 11, vibratory 90, air pressure 100 or 120, or sound pressure waves 140. Additionally, a method and apparatus is disclosed for the electrical inspection for presence or absence of the complete pattern of conductive preforms.

12 Claims, 10 Drawing Sheets

METHOD AND APPARATUS FOR RELEASE AND OPTIONAL INSPECTION FOR CONDUCTIVE PREFORMS PLACEMENT APPARATUS

This ia a continuation-in-part of U.S. patent application Ser. No. 08/789,883 filed Jan. 28, 1997.

FIELD OF THE INVENTION

This invention relates in general to the field of conductive preform placement systems for surface mount technology, and in particular to a method and apparatus for the release and optional inspection of a pattern of conductive preforms from a locating mechanism onto electronic pads that are on a receiving substrate such as for a ball grid array (BGA) applicator. The general concept of a release mechanism for a conductive preform placement and/or locating apparatus is taught in the parent patent application.

BACKGROUND OF THE INVENTION

Conventional methods for manufacturing surface mount components, or for manufacturing circuit supporting substrates for surface mount components, typically include methods for placing conductive preforms, e.g., solder balls, solder spheres, and preformed solder bumps, on electronic pads arranged in a predetermined placement pattern that is sometimes called a ball grid array (BGA).

A known method for placing conductive preforms on electronic pads on a substrate utilizes a locating plate placed over the electronic pads on the substrate to guide the conductive preforms to drop through a pattern of openings within the locating plate onto the electronic pads. The electronic pads having been pre-deposited with solder paste, the conductive preforms then adhere to the electronic pads via the solder paste. It is also recognized in the art that flux, conductive epoxy, or other tacky mediums may be used to temporarily secure the conductive preforms to the electronic pads prior to permanent attachment. During a reflow operation, the conductive preforms fuse to the electronic pads on the substrate.

The first known method of releasing the conductive preforms from the locating plate is using the tackiness of the tacky medium to pull the conductive preforms from the openings in the locating plate during separation of the locating plate and the substrate. This method does not ensure the conductive preforms are dislodged from the locating plate.

A second known method utilizes a hot-air knife to reflow the conductive preforms while using the locating plate to maintain alignment of the conductive preforms to the electronic pads of the substrate. This method additionally suffers from a hot-air knife, reflow heating step that unevenly distributes heat over the solder balls in the stencil plate. Further, the heating step applied while the conductive preforms are in the locating plate may cause the conductive preforms to melt and adhere to the locating plate. Further, the conductive preforms may change shape to geometrically couple themselves to the locating plate and cause manufacturing defects with missing solder spheres or long term reliability risks with lifted pads. Furthermore, a heating-knife motion control mechanism can be expensive.

A third known method for placing solder balls on electronic pads on a substrate utilizes tubes to hold the solder balls over the electronic pads. Each tube applies a vacuum force to hold a solder ball to the end of the tube. After locating the tubes holding the solder balls over the electronic pads, the solder balls are placed on the electronic pads by removing the vacuum force from the tubes and vertically vibrating the tubes to release the solder balls onto the electronic pads. This is actually moving the tube, not applying an externally sourced vibrational energy to the tube.

The apparatus for this third method tends to be complicated and can be expensive to produce and maintain. Since the conductive preforms are placed sequentially, the process is not conducive to cycle time. It also may not be suitable for micro-BGA placement where the pitch of the pads is very fine and requires tight tolerances in locating the solder spheres. The vibrations are used to break any static energy which would hold the solder sphere to the tube, but does not apply forces to positively separate the conductive preforms from the tube.

A fourth known method for placing conductive preforms on electronic pads on a substrate is taught in the original application which utilizes a vacuum system coupled to conductive preform locating apparatus sometimes referred to as a placement head. The placement head consists of a vacuum block and a locating plate, where the locating plate includes a pattern of openings. Each opening provides a vacuum force to lift a conductive preform into each opening. After locating the pattern of openings holding the conductive preforms proximate the pattern of electronic pads, the conductive preforms are placed on the electronic pads by removing the vacuum force from the tubes and using a tacky media to release the solder balls onto the electronic pads. A fifth known method for placing conductive preforms onto electronic pads uses preforms, where the preforms temporarily hold a pattern of conductive preforms within a removable holder. The use of preforms is not conducive to high volume production of these devices. Additionally, the current removable holder is of water soluble material and requires exposure to water for removal. It is not conducive to subject the said components to moisture, as this yields manufacturing defects and long term reliability risks. The entrapped moisture expands during the reflow process and the expansion of moisture trapped between the Integrated Circuit (IC) and the die attach pad causes them to separate.

It is known that tacky medium such as flux paste is used to remove the conductive preforms from the locating apparatus and temporarily couple the conductive preforms proximate the electronic pads. Since the forces tend to separate the conductive preform from the electronic pad, the conductive preform is generally suspended within the tacky medium. When the tacky medium is heated, as required by the securing process, the conductive preforms are known to float off the electronic pads and sometimes fuse with adjacent conductive preforms creating a defect. The use of Ball Grid Array technology is increasing as the advantages of the interconnect process are recognized. Two primary methods are used to assemble the components: 1) placing the spheres through a locating plate and 2) picking up the conductive preforms using vacuum, and generally placing them within a locating plate then transferring them to the component. A recognized problem in the high volume manufacturing process of these components is the assurance of the completeness of the pattern of conductive preforms. It is known that the completeness of the pattern is dependent upon ensuring a conductive preform is positioned within each of the locating mechanisms and subsequently transferred to the respective electronic pad. The current inspection systems utilize vision which is costly and time consuming. It is also known that the conductive preforms tend to float off the electronic pads when simply placed upon the tacky media during the curing process. The preferred separation process would include a means to position the conductive preforms against the electronic pads, where the conductive preform would not float off the electronic pad during heating.

What is desirable is a mechanism to ensure completeness of a pattern of conductive preforms, the separation between the conductive preform locating apparatus (locating plate, etc.) and the conductive preforms, depositing the conductive preforms onto a tacky media, and preferably locating the conductive preform proximate the electronic pad.

SUMMARY OF THE INVENTION

One aspect of the present invention is to provide an apparatus for placing and/or locating a pattern of conductive preforms onto a corresponding pattern of electronic pads. The apparatus comprises a conductive preform locating mechanism which includes a means of creating a pattern of conductive preforms from a unorganized volume of conductive preforms. It can be recognized that one skilled in the art may apply the invention to any of the above mentioned or other methods for the location and/or placement of conductive preforms recognizing the spirit and intent of the present invention.

Another aspect of the present invention includes a means to position an individual conductive preform in a respective locating mechanism within the conductive preform locating apparatus. The sum of the locating mechanisms create a pattern of locating mechanisms within the conductive preform locating apparatus to mimic the pattern of electronic pads on the receiving substrate.

Another aspect of the present invention is the ability to separate the pattern of conductive preforms from the pattern of locating mechanisms within the conductive preform locating apparatus by placing a releasing mechanism proximate the pattern of locating mechanisms and either directly or indirectly providing a releasing force to the conductive preforms. The releasing force may be of mechanical means (as described in the original patent application), a compliant mechanical means, vibrational energy, bulk air pressure, directed air pressure, directed sound pressure waves, etc.

Another aspect of the mechanical release embodiments of the present invention is the ability to utilize the release mechanism as a means to use electronic circuitry to inspect for completeness of the pattern of conductive preforms.

Another aspect of the present invention is the ability to include this invention in a manual, semi-automated, or automated machine.

DETAILED DESCRIPTION OF THE INVENTION

It should be noted that several figures (FIGS. 4,5,6,and 7) illustrate the release mechanism distant from the conductive preform locating member 10 for ease of identification within the figure. The release mechanism described within each figure would normally be contacting or nearly contacting the conductive preform locating apparatus 10.

Figure 1:
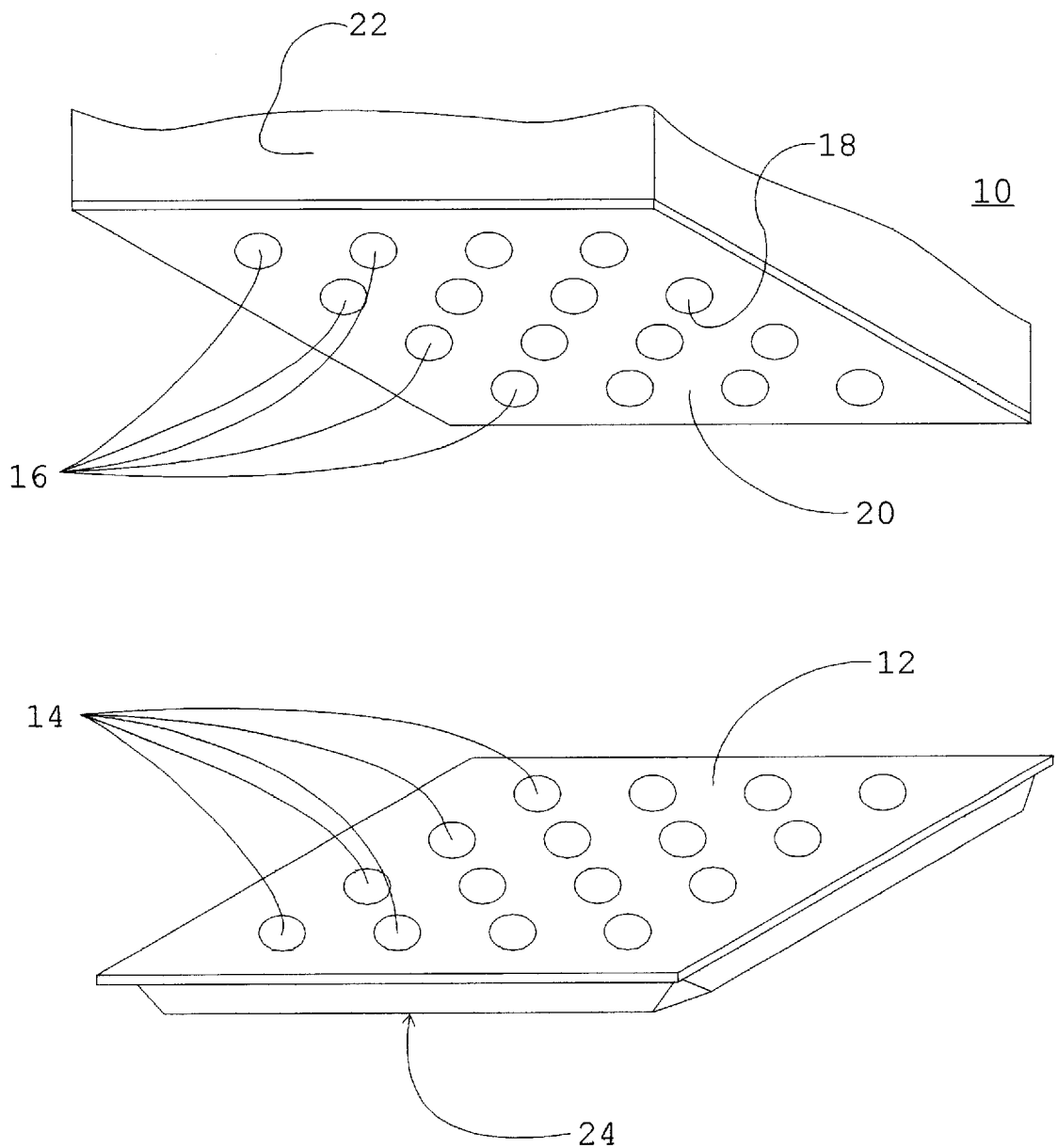
FIG. 1 is an isometric view of a conductive preform locating apparatus illustrating the pattern of respective locating locations proximate the pattern of electronic pads on a receiving substrate.

FIG. 1 illustrates an isometric view of a conductive preform locating apparatus 10 to illustrate the respective patterns between the conductive preform locating apparatus 10 and the receiving substrate 12. The conductive preform locating apparatus 10 provides a means for creating a pattern of individual conductive preforms (conductive preforms are not illustrated in FIG. 1 for clarity) from a quantity of unorganized conductive preforms and placing the said pattern of individual conductive preforms onto a pattern of electronic pads 14 on a receiving substrate 12. The pattern of individual conductive preforms is created by a pattern of locating mechanisms 16 within the conductive preform locating apparatus 10. The pattern of locating mechanisms 16 may be created in any of numerous methods including those mentioned in the background or others developed by those skilled in the art, such as chemically etched or laser etched openings within a foil, series of tubes, machined plates or blocks, laminated foils, etc. FIG. 1 illustrates one known method utilizing etched individual openings 18 within a locating foil member 20. The locating foil member 20 is generally coupled to a foil supporting member 22. The present invention describes various methods and apparatuses to separate or release the conductive preforms from the conductive preform locating apparatus 10 and the utilization of other locating devices may not deviate the spirit or intent of the present invention. It can also be recognized that the said invention may be applied to a manual, semi-automated, or automated conductive preform locating apparatus 10 which achieve the same results, without deviating from the spirit or intent of the invention.

Figure 2:
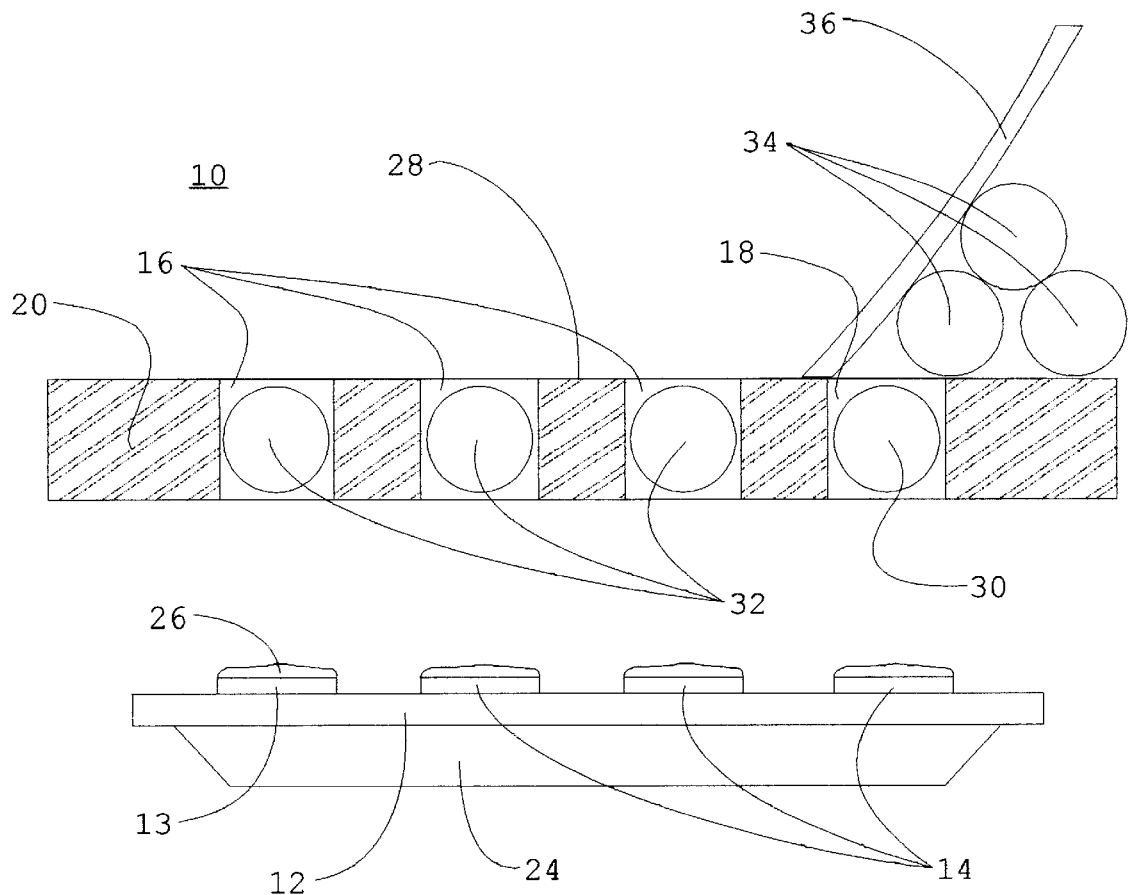
FIG. 2 is a cross sectional view illustrating a first method of positioning the conductive preforms within a conductive preform locating apparatus.

Referring to FIG. 2, is a cross sectional view of a representative conductive preform locating apparatus 10 where the volume of unorganized conductive preforms 34 are positioned within the individual locating mechanisms 18 from the top side 28. The top side 28 is defined as the side of the locating foil member 20 opposing the side which contacts the receiving substrate 12. Normally, when the conductive preforms 30 are positioned into the conductive preform locating apparatus 10 from the top side 28, a tacky media 26 is first applied to the pattern of electronic pads 14, then the pattern of locating mechanisms 16 within the conductive preform locating apparatus 10 is located proximate the pattern of electronic pads 14 on the receiving substrate 12, then the conductive preforms 30 are positioned within the locating mechanisms 16. A volume of unorganized conductive preforms 34 is passed across the pattern of locating mechanisms 16 using a conductive preform loading mechanism 36, such as a squeegee (illustrated), tilting, vibrations, airflow, or any other mechanism that can be recognized by one skilled in the art. The method of loading the conductive preforms should not be considered as a means to deviate from the spirit or intent of the invention. As the unorganized conductive preforms 34 pass across the pattern of locating mechanisms 16, an individual conductive preform 30 is positioned to each respective individual locating mechanism 18. When each of the individual locating mechanisms 18 has a respective individual conductive preform 30 positioned, the conductive preform locating apparatus 10 created the desired pattern of conductive preforms 32.

It should be recognized that FIG. 2 illustrates a foil with apertures representing the locating foil member 20 and the individual locating mechanisms 18 respectively. The locating foil member may be manufactured by various methods such as chemically etching, laser etching, machining, plating, casting, etc. and of various materials such as stainless steel, brass, copper, nickel, phenalic, plastic, etc and should not be considered a limitation for the present invention. The smaller the difference between the diameter of the individual conductive preforms 30 and the diameter of the individual locating mechanism 18, the more accurate the placement. It can also be recognized that the smaller difference may require more force to ensure separation of the conductive preform 30 and the individual locating mechanism 18. The pattern of conductive preforms 32 are transferred to the pattern of electronic pads 14, where the pattern of conductive preforms 32 are temporarily coupled to the pattern of electronic pads 14 by a tacky media 26. The present invention teaches various methods to ensure transfer of the pattern of conductive preforms 32 to the pattern of electronic pads 14.

Figure 3:
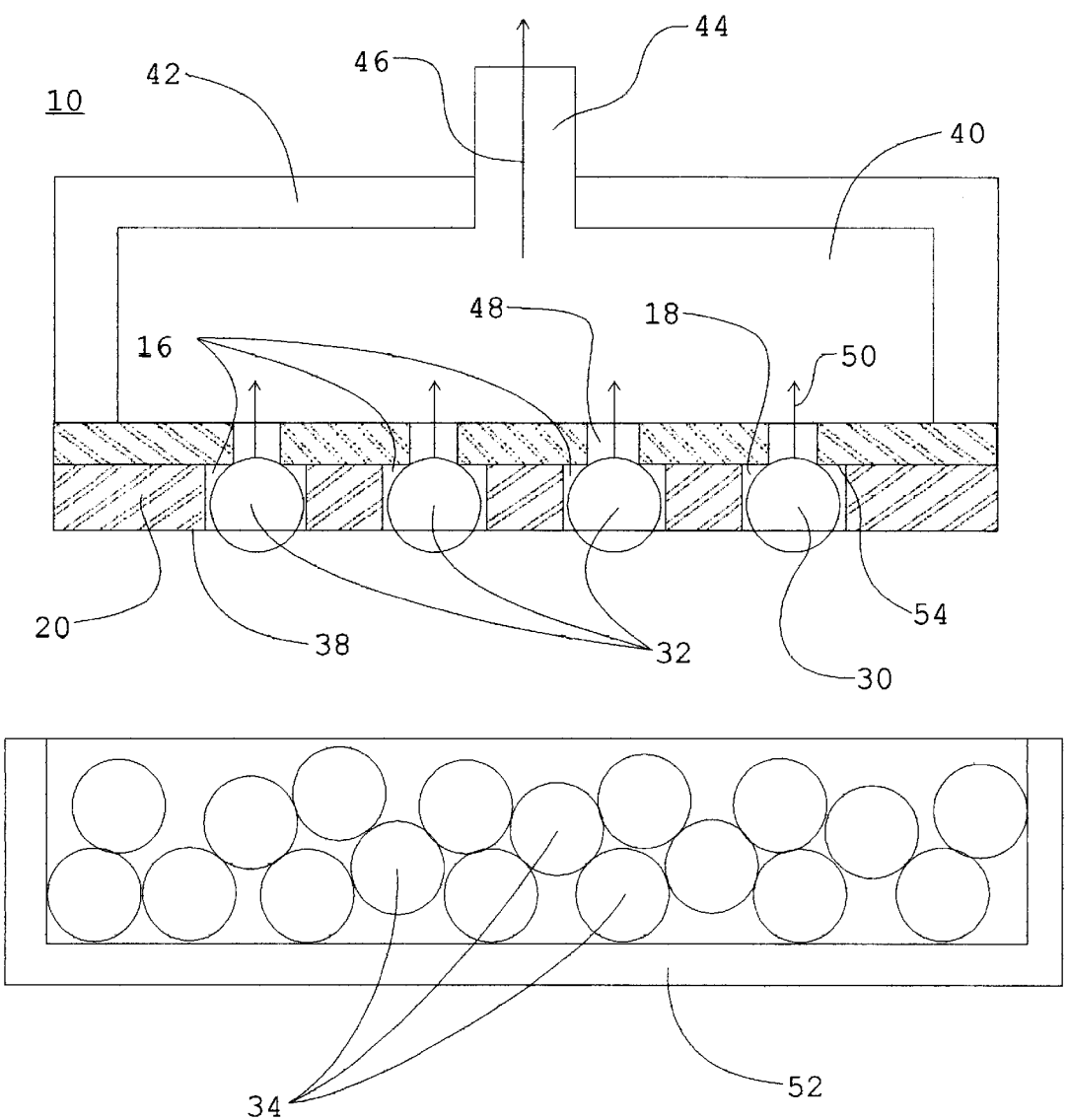
FIG. 3 is a cross sectional view illustrating a second method of positioning the conductive preforms within a conductive preform locating apparatus.

Referring to FIG. 3, is a cross sectional view of a representative conductive preform locating apparatus 10 where the volume of unorganized conductive preforms 34 is positioned within the individual locating mechanisms 18 from the bottom side 38. The bottom side 38 is defined as the side of the locating foil member 20 which contacts the receiving substrate 12. Normally, when the conductive preforms 30 are positioned from the bottom side 38, the pattern of locating mechanisms 16 within the conductive preform locating apparatus 10 is located proximate the pattern of electronic pads 14 on the receiving substrate 12 after having the individual conductive preforms 30 positioned within the individual locating mechanisms 18. The conductive preform locating apparatus 10 is generally placed proximate a volume of unorganized conductive preforms 34 within a reservoir 52. A primary vacuum force 46 is generally the mechanism used to position the individual conductive preforms 30 to each of the respective individual locating mechanisms 18 to create a pattern of conductive preforms 32. The primary vacuum force 46 is applied through a primary vacuum port 44 into a vacuum chamber 40 and distributed in a manner to apply a vacuum loading force 50 to each respective individual locating mechanisms 18 through individual vacuum ports 48. The vacuum chamber 40 is created by placing a vacuum chamber housing 42 over the pattern of locating mechanisms 16 and sealing the assembly except for the primary vacuum port 44 (which is coupled to the source of the primary vacuum force 46) and the pattern of locating mechanisms 16. The vacuum loading force 50 positions a individual conductive preform 30 within a respective individual locating mechanism 18, where the individual conductive preform 30 is captured within the individual locating mechanism 18 and against a backing member 54. The conductive preform locating apparatus 10 is then located proximate the pattern of electronic pads 14 where the pattern of conductive preforms 32 are to be deposited.

Figure 4:
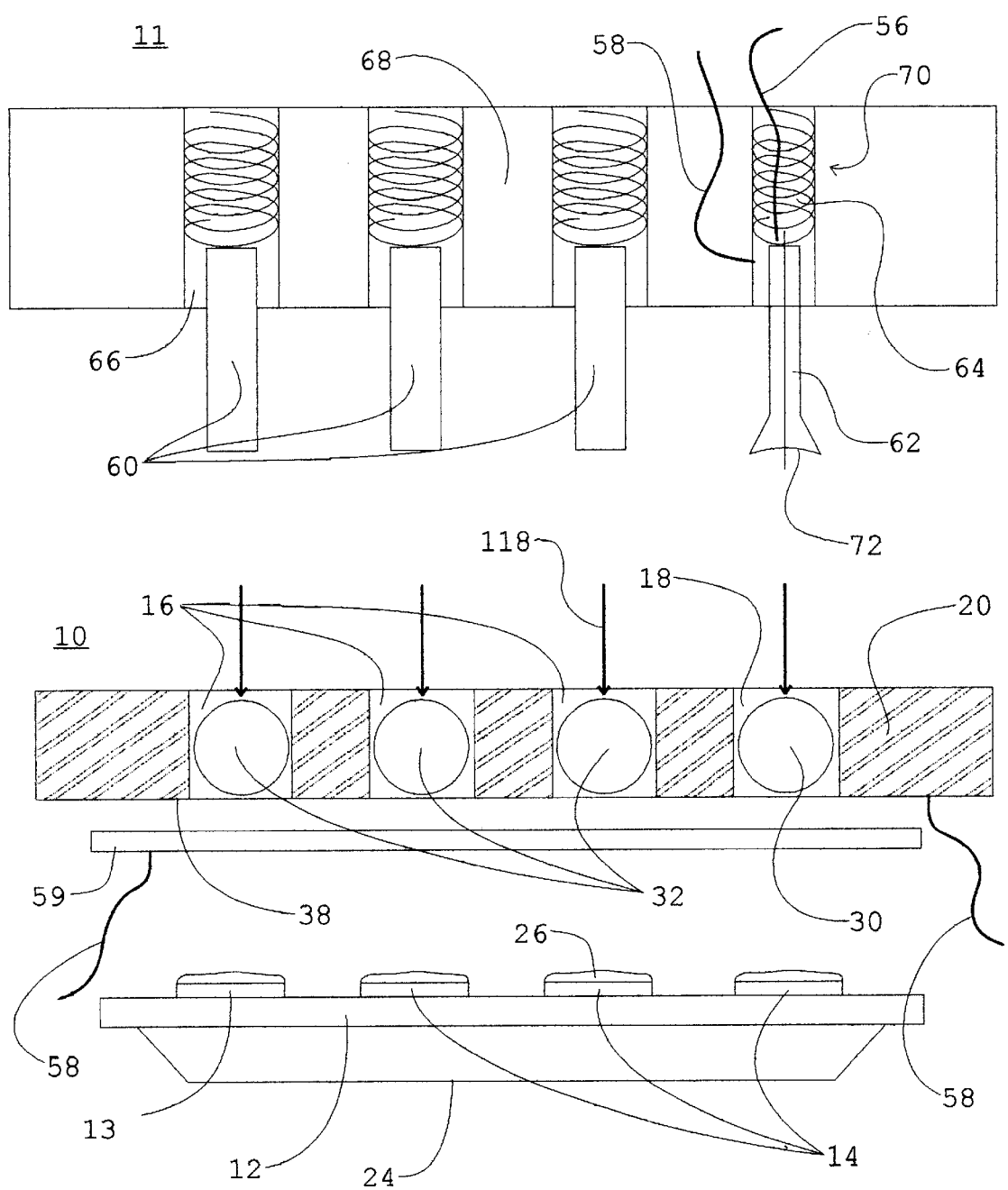
FIG. 4 is a cross sectional view of a mechanical release mechanism, including an optional compliant mechanism and optional conductive preform presence inspection system.

Referring to FIG. 4, is a cross sectional view of a representative conductive preform locating apparatus 10 including one embodiment of the present invention, where the pattern of conductive preforms 32 is separated from the conductive preform locating apparatus 10 by a pattern of mechanical release members 60. The sum of the individual release members 62 compose a pattern of mechanical release members 60 similar to the pattern of locating mechanisms 16, such that there is an individual mechanical release member 62 for each respective individual locating mechanism 18. The individual mechanical release members 62 protrude through the respective individual locating mechanisms 18 and mechanically separate the individual conductive preforms 30 from the individual locating mechanisms 18. Each individual mechanical release member 62 may include a compliant member 64 contained by a compliant member casing 66 to provide compliance to each individual mechanical release member 62. The pattern of mechanical release members 60 are located within a mechanical release supporting structure 68. The use of a compliant member maintains the spirit and intent of the original patent application applying a mechanical releasing force to the conductive preforms 30. The use of a compliant member provides for a less complicated requirement for the mechanism which operates the release mechanism, allowing the compliance to compensate for the travel distance of the operating mechanism and planarity of the mechanical release mechanism 11 to the conductive preform locating apparatus 10. The previous application described springs above the mechanical release apparatus 11, whereas the compliance in this figure is shown for each individual mechanical release member 62. A pin shaped release structure is disclosed in Hertz patent application Ser. No. 08/789,883. It is recognized that one can accomplish the same shape using many various methods, including those taught in the original application. Based upon the initial teachings, one skilled in the art could also recognize achieving the same goal by machining a pattern of holes within the mechanical release supporting structure 68 and placing fixed or compliant pins within the machined pattern of holes. This feature can be enhanced by assembling compliant pins such as "Golf-T" test probes 70 within the same locations as the fixed pins, recognizing the "Golf-T" test probes 70 would include an individual release member 62, a compliant member 64, and a compliant member casing 66. The "Golf-T" test probes 70 are spring-loaded pins which partially protrude from a casing such as a compliant member casing 66. The individual release member 62 would be in the form of a cylinder where a contacting area 72 used to separate the individual conductive preforms 30 from the individual locating mechanisms 18 is enlarged from the cylinder and the contacting area 72 is concave. The "Golf-T" test probes are one suggestion, and it should be recognized that there are many other methods of creating an apparatus which is within the spirit and intent of the present invention. The result is the transfer of the pattern of conductive preforms 32 from the conductive preform locating apparatus 10 to the tacky media 26 on the pattern of electronic pads 14, preferably proximate the electronic pads 13.

FIG. 4 may additionally provide a means for inspecting presence of the conductive preforms. Using test pins as the release members 62, one can create a continuous circuit when contacting the individual conductive preforms 30. The continuous circuit may be created by either the completion of a circuit where the compliant member 64 would be compressed allowing the release member 62 to close a circuit, or where the release member 62 would contact the conductive preform 30 and conductive preform 30 would close a circuit. A first side of the circuit 56 would be attached to the release member 62 and a second side of the circuit 58 would be attached to either each compliant member casing 66, the conductive preform locating apparatus 10 or a conductive member 59. The conductive member 59 would be required is the conductive preform locating apparatus is nonconductive. The conductive member 59 would preferably be placed under the conductive preform locating apparatus 10 prior to loading the conductive preforms into the conductive preform locating apparatus 10. The electrical conductivity of the conductive preform locating apparatus 10 or the conductive member 59 would provide a second side of the circuit to each conductive preform 30. The circuit would be continuous when the first side of the circuit 56 provides a electrical path to the mechanical release member 62 which contacts the electrically conductive individual conductive preforms 30 which then contact the second side of the circuit 58 provided through the conductive member 59 or the conductive preform locating apparatus 10. Alternatively, the circuit would be continuous when the first side of the circuit 56 provides an electrical path the to second side of the circuit 58 where the second side of the circuit is electrically connected to the compliant member casing 66 and the circuit is completed by the motion of the mechanical release member 62 upon contacting the conductive preforms 30. The second described electrically continuous path does not require that the conductive preforms be conductive upon all potential areas of contact, nor the requirement of a conductive member 59 or conductive-conductive preform locating apparatus 10. The separate conductive member 59 would be less desirable as it must be removed prior to placement of the pattern of conductive preforms 32. A logic circuit (not shown) can compare continuity to determine presence of the conductive preforms 30 to determine the completeness of the pattern of conductive preforms 32. The logic circuit can be of many variations, as designed by anyone skilled in the art. The logic circuit and actual means to create a continuous circuit should not be limiting the spirit or intent of the embodiment.

Figure 5:
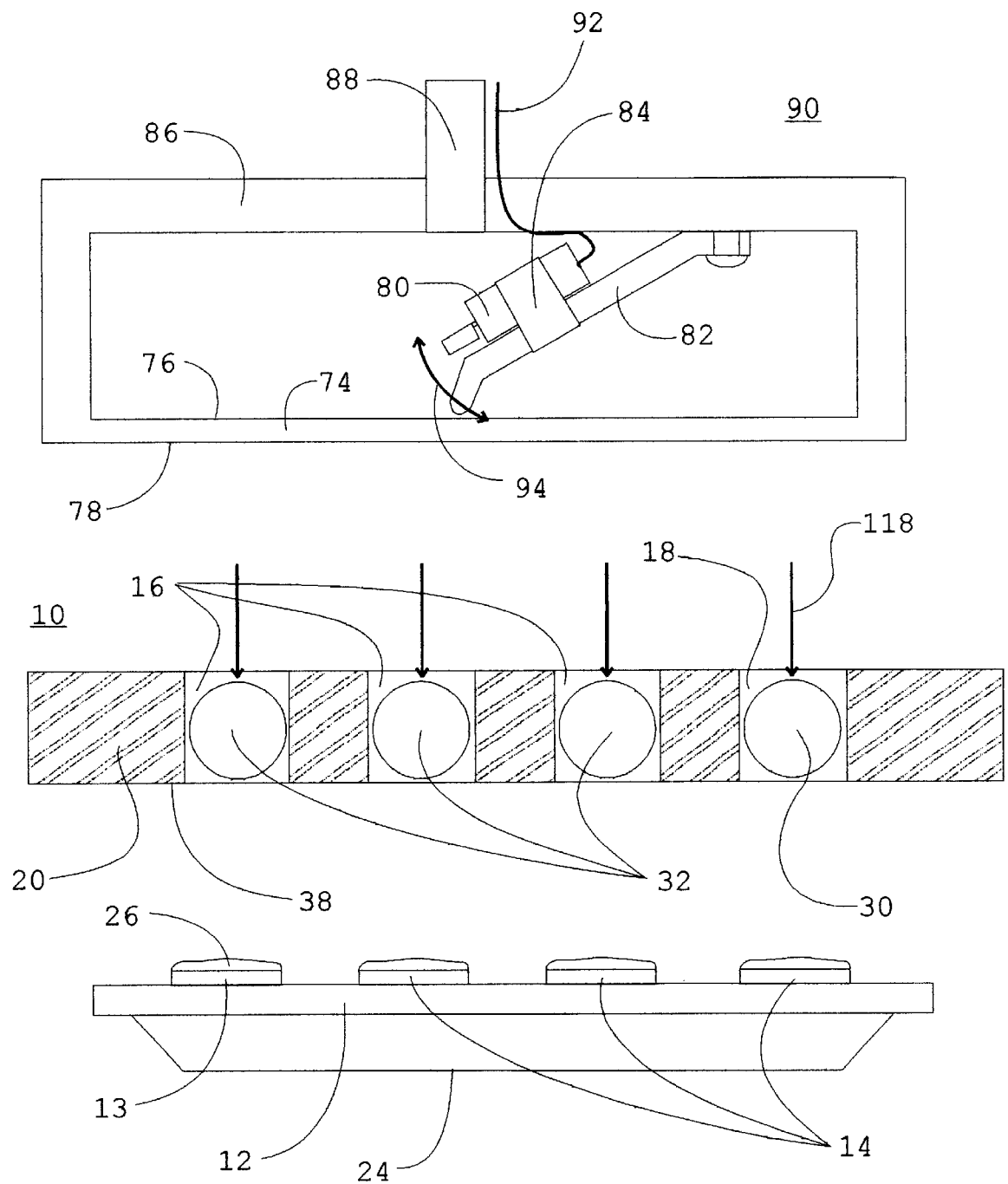
FIG. 5 is a cross sectional view of a vibrational release mechanism.

FIG. 5 is a cross sectional side view of a second embodiment of the present invention. The cross sectional side plan view of the conductive preform placement apparatus 10 illustrates a release mechanism which utilizes vibrational energy to release the pattern of conductive preforms 32 from the pattern of locating mechanisms 16. The use of vibrational energy does not dictate the requirement that the individual release members 62 contact the individual conductive preforms 30 to separate the individual conductive preforms 30 from the respective individual locating mechanisms 18. Additionally, the second embodiment of the present invention does not require customization or alignment for each pattern. By adding a backing member 74, the vibrational energy directs the separation of the individual conductive preforms 30 away from the conductive preform locating apparatus 10 and onto the respective individual electronic pads 13. The backing member 74 includes two surfaces, a vibrational contacting surface 76 and a locating mechanism contacting surface 78. Although requiring more design considerations, it can be recognized that the vibrational contacting surface 76 may be the same side as the locating contacting surface 78, keeping within the spirit and intent of the present invention. The vibrational energy may be transferred to the surface of the backing member 74 using any of known vibrational source devices, including but not limited to an off-balanced motor 84, a piezoelectric transducer (not shown), or a mass resonant vibrator. FIG. 5 illustrates the use of an off-balanced motor 84 coupled to a resilient tapping member 82 via a motor coupling member 86. Preferably, the resilient tapping member 82 and the backing member 74 are coupled to a primary fixture 86 creating a vibrational release apparatus 90 which may be brought to and from the locating mechanisms 18. In order to automate the application, the vibrational release apparatus 90 may be coupled to a controlling mechanism (not shown) by a coupling mechanism 88.

The operation of the second embodiment would be to bring the vibrational release apparatus 90 to a position where the locating contacting surface 82 of the backing member 74 contacts the pattern of locating mechanisms 16. FIG. 5 illustrates one method of creating and applying vibrational energy to the backing member. The illustration utilizes an off-balanced motor 84 which is energized through wires 92. When the off-balanced motor 84 is energized, the off-balanced motor 84 generates a vibration; the vibration causes the resilient tapping member 82 to oscillate 94, causing a resilient tapping member 82 to tap the backing member 74. The force resulting from the tapping causes the individual conductive preforms 30 to separate from the individual locating mechanisms 18. The backing member ensures that the individual conductive preforms 30 are separated towards the individual electronic pads 13. It can be recognized that one skilled in the art may include the backing member 74 within the vibrational source or within the individual locating mechanisms 18 such as described in the original patent application. The tapping generates a sudden shock, whereas the vibration generates a slower separation and may utilize gravity to overcome the potential of the releasing away from the individual electronic pads 13. It should be recognized that either vibrational or tapping forces may be created and applied in numerous ways without deviating from the spirit or intent of the present embodiment. The result is the transfer of the pattern of conductive preforms 32 from the conductive preform locating apparatus 10 to the tacky media 26 on the pattern of electronic pads 14.

Figure 6:
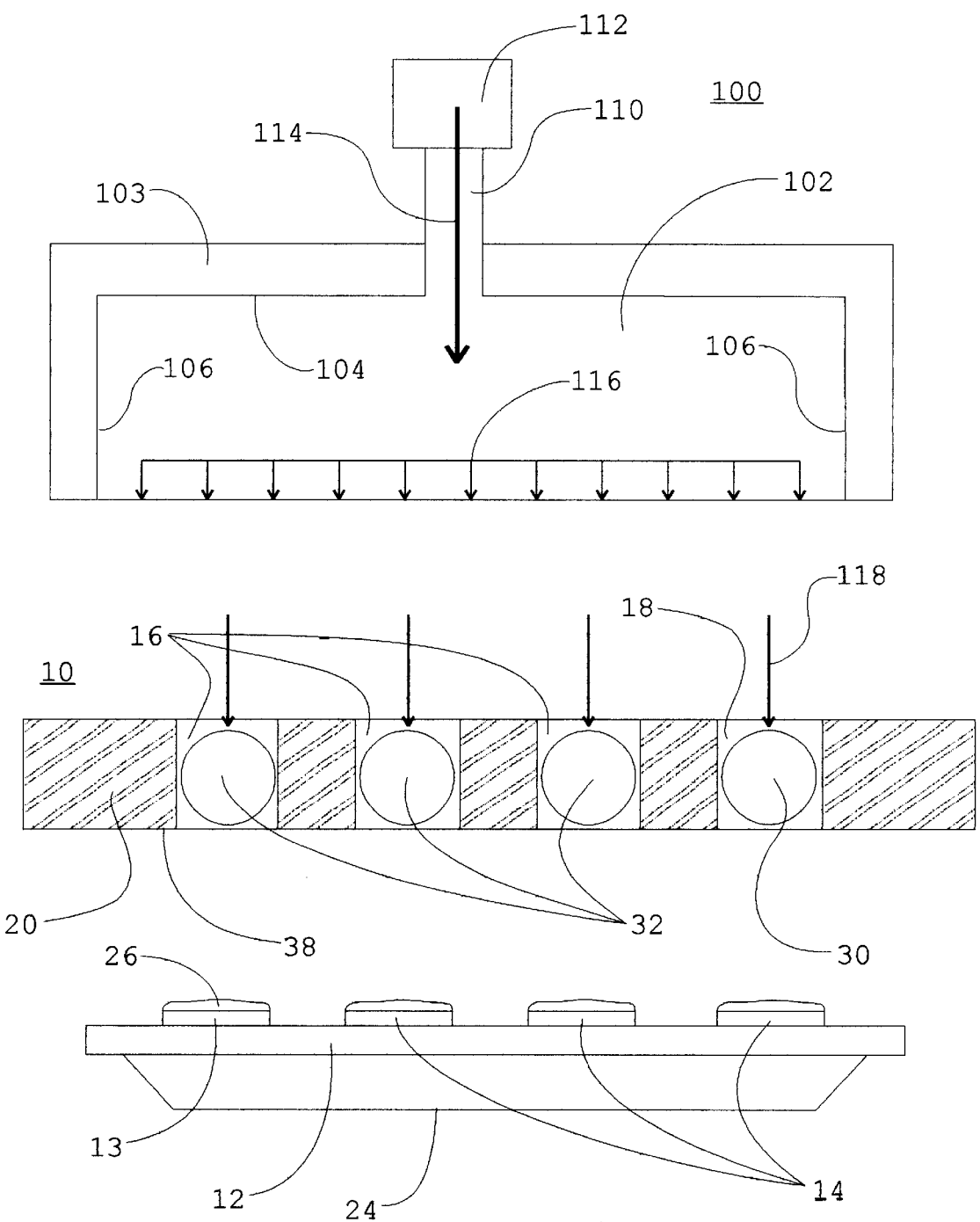
FIG. 6 is a cross sectional view of an air pressure release mechanism.

FIG. 6 is a cross sectional view of a general air pressure release mechanism 100. The general air pressure release apparatus 100 requires a passage within each individual locating mechanism 18 to allow the flow of air 114 to provide a releasing force 118 to the individual conductive preforms 30. The advantage to this system over the vibrational release apparatus 90 is the lack of electrical requirements and mechanical wear on the components of the apparatus. The advantage over the mechanical release apparatus 11 is the lack of requirements for aligning the pattern of mechanical release members 60 to the pattern of locating mechanisms 16. The general air pressure release apparatus 100 takes incoming air flow 114 provided by an air pressure source 112 such as a compressor or in house pressurized air supply and distributes the incoming air flow 114 within an expansion chamber 102 to provide a distributed air pressure 116 against the conductive preform locating apparatus 10 on the side opposing the desired direction for release. The expansion chamber 102 is an area which includes an inlet port 110 and an enclosure 103. The enclosure 103 may consist of an inlet port 110, a top surface 104, a side surface 106, and an open area 108. The air pressurizes within the expansion chamber 102 and releases against the least resistant path, the passages through the individual locating mechanisms 18. The escaping air provides the releasing force 118 to the individual conductive preforms 30 to cause them to separate from the individual locating mechanisms 18. The result is the transfer of the pattern of conductive preforms 32 from the conductive preform locating apparatus 10 to the tacky media 26 on the pattern of electronic pads 14.

Figure 7:
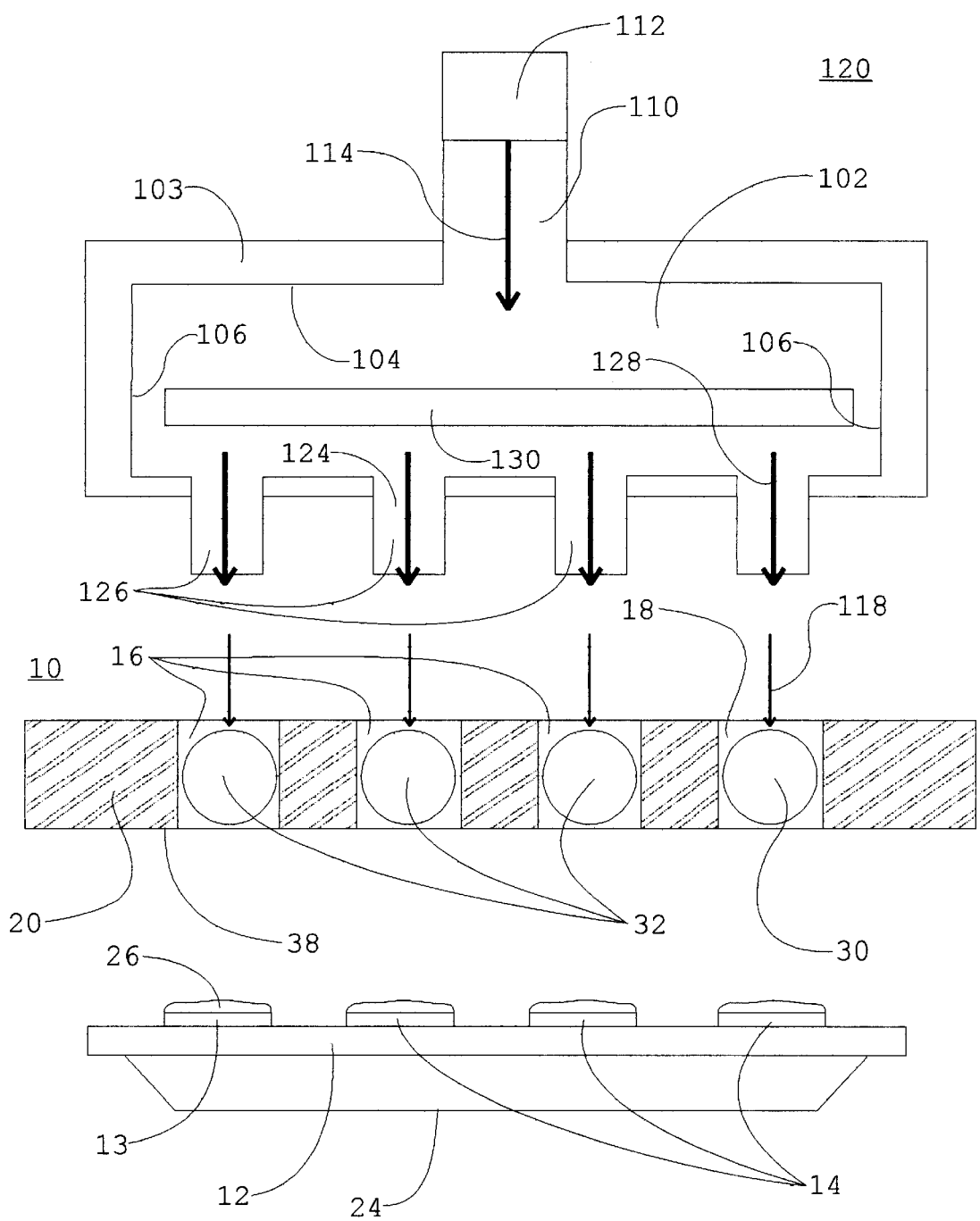
FIG. 7 is a cross sectional view of a directed air pressure release mechanism.

FIG. 7 illustrates a directed air pressure release apparatus 120, similar to the general air pressure release apparatus 100 with the addition of a pattern of air exit ports 126 to direct the escaping air into a pattern of directed release airflow forces 128 similar to the pattern of locating mechanisms 16. The directed air pressure release apparatus 120 requires a passage within each individual locating mechanism 18 to allow the flow of air 114 to provide a releasing force 118 to the individual conductive preforms 30. The directed air pressure release apparatus 120 takes incoming air flow 114 provided by an air pressure source 112 and, optionally using a diffuser 130, distributes the incoming air flow 114 within an expansion chamber 102. The air within the expansion chamber 102 escapes through the path of least resistance, the pattern of air exit ports 126. The expansion chamber 102 is an area which includes an inlet port 110 and an enclosure 103. The enclosure 103 may consist of an inlet port 110, a top surface 104, a side surface 106, a bottom surface and a pattern of air exit ports 126. The air pressurizes within the expansion chamber 102 and releases against the least resistant path, the pattern of air exit ports 126. A diffuser 130 may be included to equally distribute the inlet airflow 114 across the pattern of air exit ports 126. It should be recognized that a diffuser may be included in the previous embodiment. The directed release airflow forces 128 provides the releasing force 118 to the individual conductive preforms 30 to cause them to separate from the individual locating mechanisms 18. The result is the transfer of the pattern of conductive preforms 32 from the conductive preform locating apparatus 10 to the tacky media 26 on the pattern of electronic pads 14.

Figure 8:
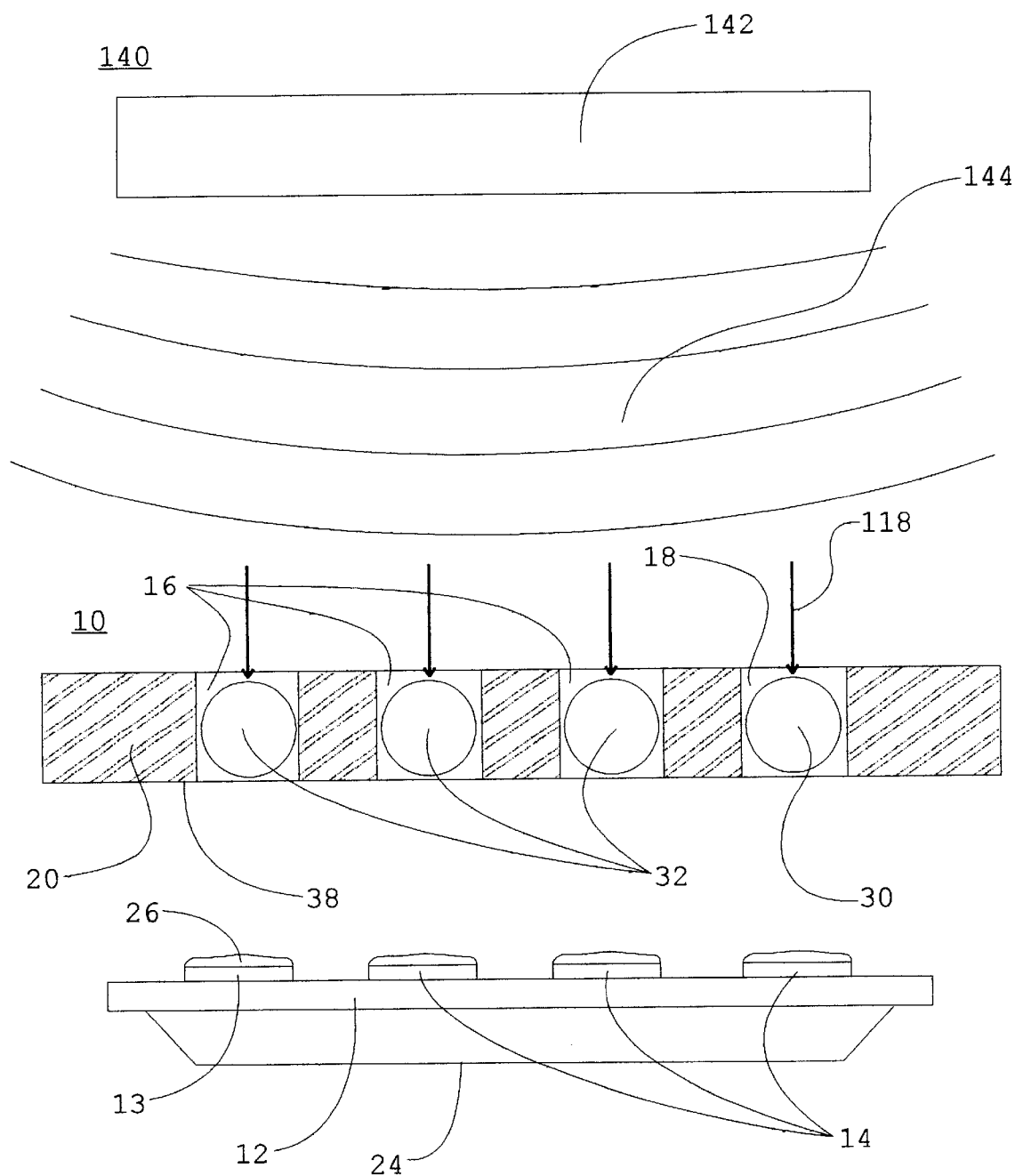
FIG. 8 is a cross sectional view of a sound pressure wave release mechanism.

FIG. 8 is a cross sectional view of a directed sound pressure wave release apparatus 140. The sound pressure wave apparatus 140 utilizes a transducer 142 generates sound pressure waves 144. The transducer 142 may be of any known sound generating apparatus, such as speaker, ultrasonic horn, mass resonant generator, etc. understanding the effectiveness may be based upon the selected frequency or variations in frequencies, amplitude, and distance. The sound pressure waves provide a release force 118 which separates the conductive preforms 30 from the locating apparatus 10. Additionally, the sound pressure waves 144 cause the individual components of the system, more specifically, the conductive preforms 30 and the conductive preform locating apparatus 10 to oscillate at their natural frequencies. Since the mass and spring constant of each component is generally different, they oscillate at different frequencies, reducing friction or static forces (not shown) between the conductive preforms 30 and the conductive preform locating apparatus 10 which are known to retain the conductive preforms 10 within the locating apparatus 10.

Figure 9:
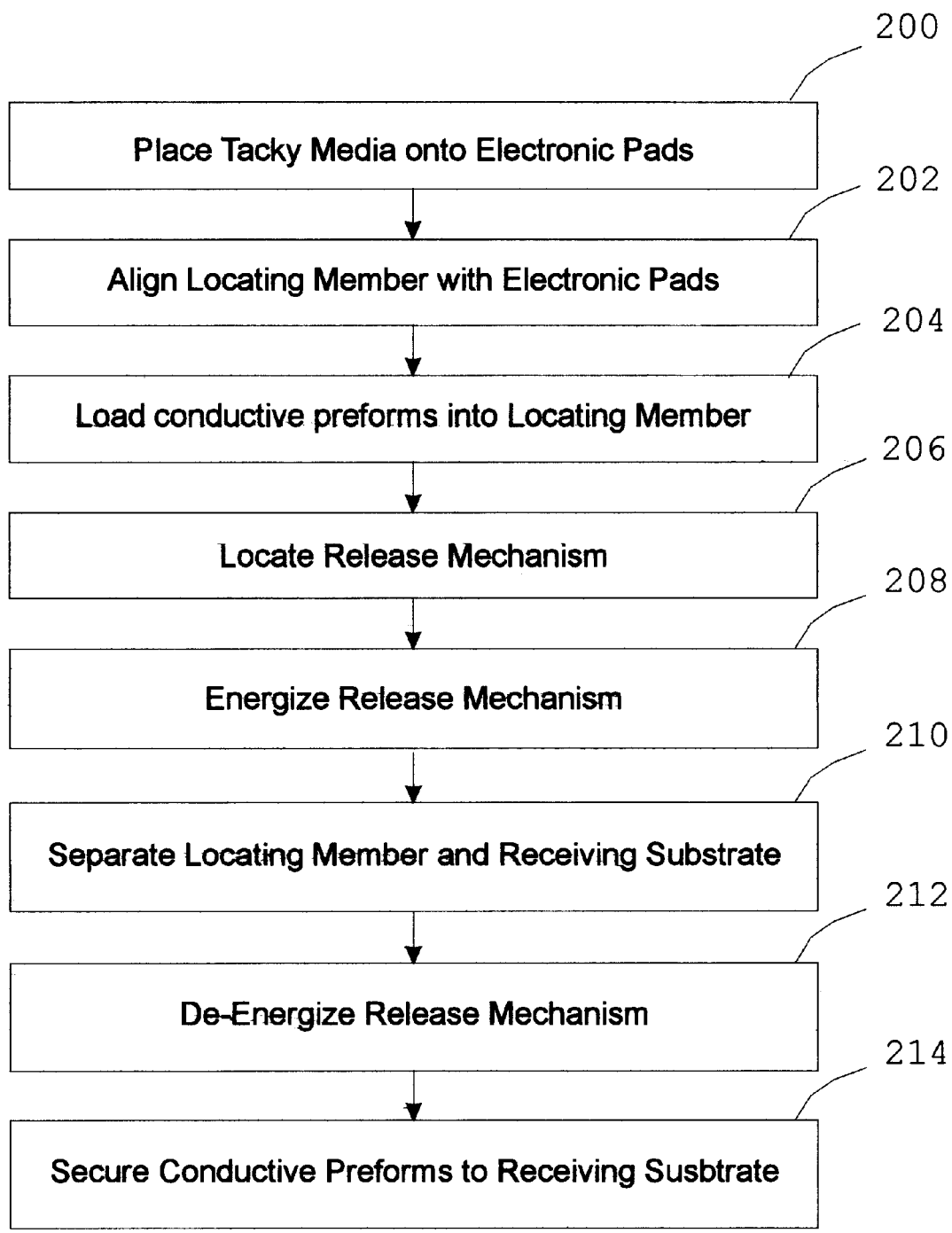
FIG. 9 is a flow diagram illustrating locating, placing, and releasing conductive preforms onto electronic pads of a receiving substrate using a top loading conductive preform locating device.

FIG. 9 is an operational flow diagram demonstrating the method for locating, placing, and releasing a pattern of conductive preforms 32 onto a pattern of electronic pads 14 of a receiving substrate 12 using a topside 28 loading conductive preform locating device 10. The first top-loading placement step 200 to positioning the conductive preforms 30 is to place a tacky media 26 onto the electronic pads 14 of the receiving substrate 12. This can be accomplished through various known techniques. One method which can be used would be to apply a tacky media 26 such as flux, solder paste, or conductive epoxy, onto the electronic pads 14 by dispensing, screen printing or other well known processes. The second top-loading placement step 202 is to align the pattern of locating mechanisms 16 within a conductive preform locating apparatus 10 to the pattern of electronic pads 14 of the receiving substrate 12. This can be accomplished through various means such as but not limited to mechanical alignment, vision-assisted alignment, or any other known method of aligning two patterns as by one skilled in the art. The third top-loading placement step 204 is to position the individual conductive preforms 30 from a volume of unorganized conductive preforms 34 into the individual locating mechanisms 18 through various means such as: Passing volume of unorganized conductive preforms 34 across the pattern of locating mechanisms 16 using a conductive preform loading mechanism 36, such as a squeegee (illustrated), vibrations, airflow, or any other mechanism that can be recognized by one skilled in the art (see FIG. 2). It should be recognized that the conductive preforms 30 may be loaded into the conductive preform locating apparatus 10 in numerous ways without deviating from the spirit or intent of the present embodiment. The forth top-loading placement step 206 is to locate the release mechanism (any of the described or implied embodiments) proximate the conductive preform locating apparatus 10. Generally, the release mechanism would be located to the side of the conductive preform locating apparatus 10 opposing the pattern of electronic pads 14. Where alignment is required, the alignment may be of any means described above. The fifth top-loading placement step 208 is to energize and/or activate the release mechanism such that the release mechanism applies a releasing force 94, 118 to the conductive preforms 30 or the conductive preform locating apparatus 10. The sixth top-loading placement step 210 is to separate the conductive preform locating apparatus 10 and the receiving substrate 12 resulting in the release and placement of a pattern of conductive preforms 32 onto the tacky media 26 deposited on the pattern of electronic pads 14. The seventh top-loading placement step 212 is to de-energize the release mechanism and separate it from the conductive preform locating apparatus 10 to allow for the conductive preform locating apparatus 10 to be reloaded with the individual conductive preforms 30 for the next cycle of operation. The final top-loading placement step 214 in the process is to optionally remove the component from the apparatus and secure the conductive preforms 30 to the pattern of electronic pads 14 on the receiving substrate 12. The securing (bonding) process would be respective of the material used for the tacky media 26. Some examples would be reflow for flux or solder paste or curing for conductive epoxy. It should be recognized that there are many other methods of placing, and releasing conductive preforms onto electronic pads of a receiving substrate using a top loading conductive preform locating device apparatus which is within the spirit and intent of the present invention.

Figure 10:
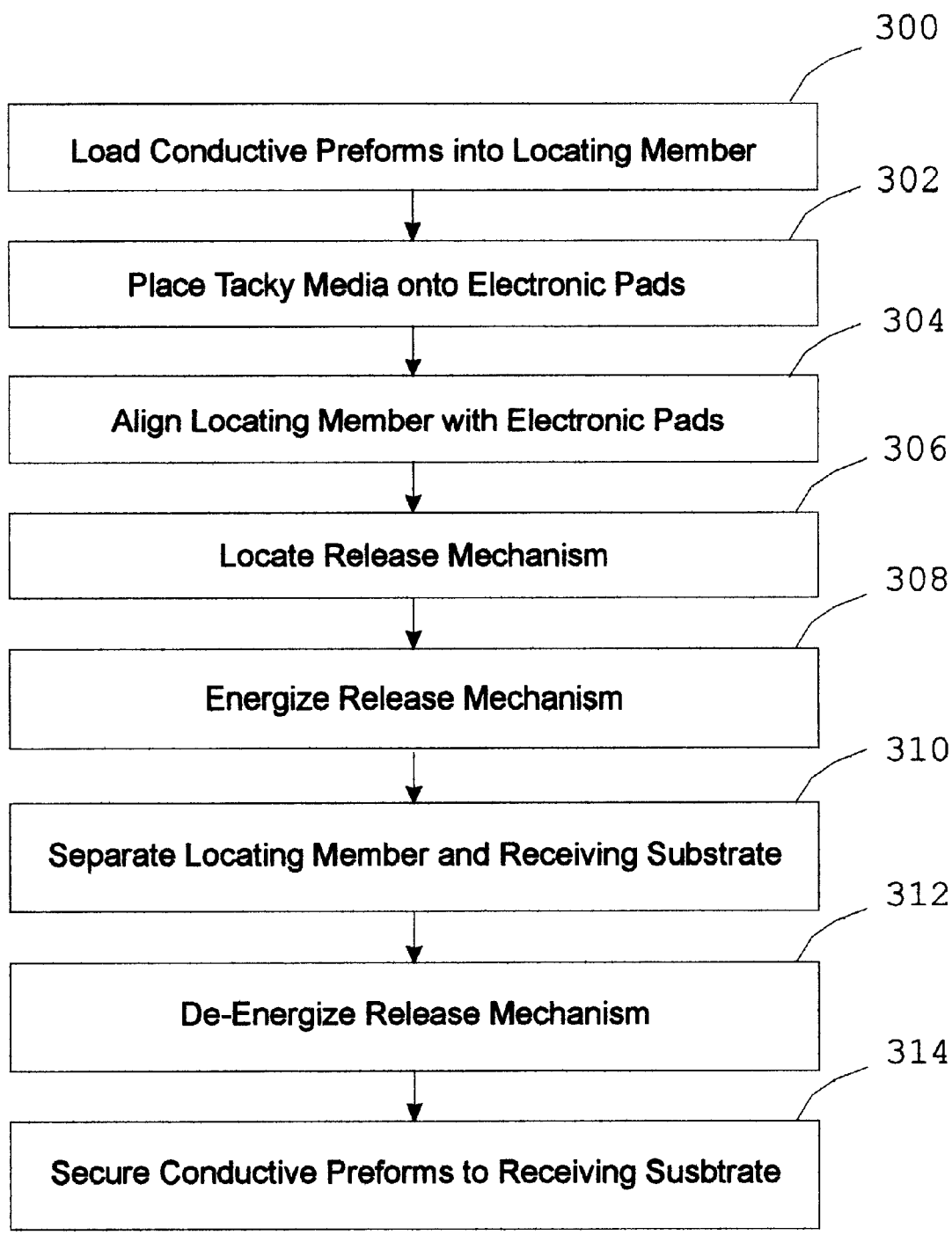
FIG. 10 is a flow diagram illustrating the method of locating, placing, and releasing conductive preforms onto electronic pads of a receiving substrate using a bottom loading conductive preform device.

FIG. 10 is a flow diagram illustrating the method of locating, placing, releasing conductive preforms onto electronic pads of a receiving substrate using a bottom loading conductive preform device. The first bottom-loading step 300 to placing and/or locating the conductive preforms 30 is to subject the conductive preform locating apparatus 10 to a volume of unorganized conductive preforms 34. The individual conductive preforms 30 are positioned into the individual locating mechanisms 18 generally using a primary vacuum force 46. The primary vacuum force 46 is applied through a primary vacuum port 44 into a vacuum chamber 40 and distributed in a manner to apply a vacuum loading force 50 to each respective individual locating mechanisms 18 through individual vacuum ports 48. The vacuum chamber 40 is created by placing a vacuum chamber housing 42 over the pattern of locating mechanisms 16 and sealing the assembly except for the primary vacuum port 44 (which is coupled to the source of the primary vacuum force 46) and the pattern of locating mechanisms 16. The vacuum loading force 50 positions an individual conductive preform 30 within a respective individual locating mechanism 18, where the individual conductive preform 30 is captured within the individual locating mechanism 18 and against a backing member 54. The conductive preforms 30 maintains the pattern to mimic that of the electronic pads 14 where the pattern of conductive preforms 32 are to be deposited (see FIG. 3). It should be recognized that the conductive preforms 30 may be positioned into the conductive preform locating apparatus 10 in numerous ways without deviating from the spirit or intent of the present invention. The second bottom-loading step 302 is to place a tacky media 26 onto the electronic pads 14. This can be accomplished using any of various known techniques, such as screen printing, pin transfer, dispensing, etc. The tacky media may be flux, solder paste, conductive epoxy, or any other similar material recognized for the assembly of electronics devices. The third bottom-loading step 304 is to align a conductive preform locating apparatus 10 to the pattern of electronic pads 1 of the receiving substrate 12. This can be accomplished through various means such as but not limited to alignment pins, manual, semi-automated, or automated means of alignment. The forth bottom-loading step 306 is to locate the release mechanism proximate the pattern of electronic pads 14 of the substrate 24. This can be accomplished through various means such as but not limited to alignment pins, fixturing, manual, semi-automated, automated, with or without vision assisted means of alignment. The fifth bottom-loading step 308 is to energize and/or activate the release mechanism to release and deposit the pattern of conductive preforms 32 onto the electronic pad 14 (see FIGS. 4 through 8). The release force 118 may result from a mechanical release apparatus 11, a vibrational release apparatus, an air pressure release apparatus, a directed air pressure release apparatus, or sound pressure waves apparatus. The sixth bottom-loading step 310 to placing and/or locating the pattern of conductive preforms 32 to the pattern of electronic pads 14 is to separate the conductive preform locating apparatus 10 from the electronic pads 14 and the receiving substrate 12, positioning the pattern of conductive preforms 32 on the tacky media 26. The seventh bottom-loading step 312 is to de-energize the release mechanism to allow for the conductive preform locating apparatus 10 to be re-loaded with the conductive preforms 30 for the next operation. The final bottom-loading step 314 in the process is to optionally remove the component from the apparatus and secure the conductive preforms 30 to the receiving electronic pads 14 of the substrate 24. The securing or bonding process would be respective of the material used for the tacky media 26. Some examples would be reflow for flux or solder paste or curing for conductive epoxy. It should be recognized that there are many other methods of placing, locating, and releasing conductive preforms onto electronic pads of a receiving substrate using a bottom loading conductive preform locating device apparatus which is within the spirit and intent of the present invention.

What is claimed is:

1. An apparatus for the placing of a pattern of conductive preforms onto a pattern of electronic pads on a Ball Grid Array, the apparatus comprising:

a conductive preform locating apparatus comprising a pattern of openings, a means for positioning individual conductive preforms into the pattern of openings of the conductive perform apparatus to create a pattern of conductive preforms, a means for aligning the pattern of electronic pads and the pattern of openings of the locating apparatus proximate each other, a pattern of pins, an electrical inspection system, whereby the electrical inspection system utilizes the plurality of pins, and a logic circuit interfaced to the electrical inspection system to determine the completeness of the pattern of conductive preforms.

2. The apparatus of claim 1, the electrical inspection system comprising:

a means to provide an individual circuit respective to each individual location of each respective conductive preform, a first side of a circuit coupled to at least a portion of the individual pins, a second side of a circuit coupled to a second member such that when each individual pin contacts the individual conductive preforms the circuit changes from at least one of open to closed and close to open, and a logic circuit to determine the completeness of the pattern of conductive preforms.

3. The apparatus of claim 2, where both the first side of the circuit and the second side of the circuit are mated to the pins.

4. The apparatus of claim 2, whereby the circuit creates a continuous circuit between the individual pins and a second member, the continuous circuit path comprising the individual pins contacting the individual conductive preforms contacting the second member.

5. The apparatus of claim 2, where the circuit further includes the conductive performs.

6. The apparatus of claim 1, whereby at least one pin of the plurality of pins further comprises a compliant member.

7. The apparatus of claim 1, the apparatus further comprising a compliant member used to at least partially operate the plurality of pins.

8. The apparatus of claim 6, the electrical inspection system comprising:

a means to provide an individual circuit respective to each individual location of each respective conductive preform, a first side of a circuit coupled to at least a portion of the individual pins, a second side of a circuit coupled to a second member such that when each individual pin contacts the individual conductive preforms the circuit changes from at least one of open to closed and closed to open, and a logic circuit to determine the completeness of the pattern of conductive preforms.

9. The apparatus of claim 8, where both the first side of the circuit and the second side of the circuit are mated to the pins.

10. The apparatus of claim 8, whereby the circuit creates a continuous circuit between the individual pins and a second member, the continuous circuit path comprising the individual pins contacting the individual conductive preforms contacting the second member.

11. The apparatus of claim 8, where the circuit further includes the conductive performs.

12. An apparatus for placing a pattern of conductive preforms onto a pattern of electronic pads on a substrate, the apparatus comprising:

a conductive preform locating apparatus comprising a top plate with a plurality of openings for creating a pattern of conductive preforms, a second plate located below the top plate used to hold the plurality of conductive preforms within the plurality of openings of the top plate, a means for moving the second plate to release the conductive preforms from the plurality of openings of the first plate, a plurality of pins to apply a force to the plurality of conductive preforms and towards the electronic pads, and a means for inspecting the completeness of the solder spheres prior to placement onto the electronic pads.

* * * * *